US00RE34378E

United States Patent [19]

Sawai et al.

[11] E Patent Number: Re. 34,378

[45] Reissued Date of Patent: Sep. 14, 1993

[54] LIGHT EMITTING DEVICE WITH IMPROVED ELECTRODE STRUCTURE TO MINIMIZE SHORT CIRCUITING

[75] Inventors: Masaaki Sawai, Komoro; Masamichi Kobayashi, Kodaira; Shoji Hayashi, Takasaki; Hiroshi Naka, Komoro; Masahiro Ichiki, Tamamura, all of Japan

[73] Assignee: Hitachi, Ltd., Tokyo, Japan

[21] Appl. No.: 615,827

[22] Filed: Nov. 15, 1990

Related U.S. Patent Documents

Reissue of:

[64] Patent No.: 4,785,455
Issued: Nov. 15, 1988
Appl. No.: 78,097
Filed: Jul. 27, 1987

U.S. Applications:

[62] Division of Ser. No. 712,029, Mar. 15, 1985, Pat. No. 4,692,927.

[30] Foreign Application Priority Data

Mar. 16, 1984 [JP] Japan ..... 59-49033
Apr. 13, 1984 [JP] Japan ..... 59-72819

[51] Int. Cl.[5] ..... H01S 3/19

[52] U.S. Cl. ..... 372/46; 372/45; 257/99

[58] Field of Search ..... 372/44, 45, 46; 357/17, 357/65, 68; 257/99

[56] References Cited

U.S. PATENT DOCUMENTS

| | | | |
|---|---|---|---|
| 4,352,187 | 9/1982 | Amann | 372/46 |
| 4,376,307 | 3/1983 | Rozzi et al. | 372/46 |
| 4,692,927 | 9/1987 | Sawai et al. | 372/46 |
| 4,731,790 | 3/1988 | Sawai | 372/46 |

*Primary Examiner*—James W. Davie
*Attorney, Agent, or Firm*—Antonelli, Terry, Stout & Kraus

[57] ABSTRACT

A light emitting device is disclosed which includes a semiconductor block, an active layer disposed in such a fashion as to penetrate through the mutually facing end surfaces of the semiconductor block, and an electrode disposed on the main plane of the semiconductor block, wherein the electrode consists of a first electrode portion disposed along the active layer, and a second electrode portion continuing integrally the first electrode portion and having the periphery thereof out of contact from the periphery of the second main plane of the semiconductor block. A current is caused to uniformly flow through the entire active layer, and a light emitting operation is carried out stably. Since the electrode is not disposed on the periphery of the semiconductor block, the occurrence of junction short-curcuit, which might otherwise occur when a wafer is cut off to produce laser chips or when the corners of the chip break off, can be reduced.

21 Claims, 4 Drawing Sheets

LIGHT EMITTING DEVICE WITH IMPROVED ELECTRODE STRUCTURE TO MINIMIZE SHORT CIRCUITING

Matter enclosed in heavy brackets [ ] appears in the original patent but forms no part of this reissue specification; matter printed in italics indicates the additions made by reissue.

This is *a reissue of U.S. Pat. No. 4,786,455, which is a* divisional of application Ser. No. 712,029, filed Mar. 15, 1985 now U.S. Pat. No. 4,692,927.

BACKGROUND OF THE INVENTION

This invention relates to a light emitting device, and more particularly to a semiconductor laser device.

A semiconductor laser chip as a light source for optical communication or for data processing units such as digital audio disks, video disks, and so forth is discussed, for example, by Oka et al in the article entitled "Innovation of Semiconductor Laser Technique" on page 25 of the May issue of "Semiconductor World", 1982.

A prior art reference ("Semiconductor Laser Satisfying Requirements of Audio Disks" by Fushiki et al in the September 14 issue of "Nikkei Electronics", p.p. 138–152) discloses that a semiconductor laser chip (which will hereinafter be referred to also as "laser chip") can be formed by cutting (causing cleavage) of a wafer having formed thereon electrodes, with the electrode having a multi-layered metal structure using mostly gold (Au) as its principal material.

The inventor of this invention has found out that when the wafer is cut to produce the laser chips, Au as the electrode is stretched and torn off. Because of this, a part of the AU electrode hangs down in the proximity of the chip and often causes a junction short-circuit defect.

The inventor has also clarified that when the laser chip described above is produced, the electrode disposed on one surface of the laser chip is likely to swell out and to hang down for the following reasons, and hence a short-circuit is likely to develop around a p-n junction.

The laser chip has a structure in which a multi-layered grown layer is formed on a main plane of a substrate which is about 100 μm thick, and in which laser light is emitted from the end surface of an active layer as one of the constituent layers of the multi-layered grown layer (more accurately, the end surface of a resonator). At least one of the electrodes is disposed on the side of the upper surface of the multi-layered grown layer. The distance between the electrode on the multi-layered grown layer and the active layer is extremely small, e.g. about 3 μm. Therefore, if the electrode on the multi-layered grown layer swells out and hangs down from the periphery of the laser chip, the hanging portion of the electrode comes into contact with a region of a different conductivity type while bridging the pn-junction, or comes into contact with the p-n junction itself, thereby causing an electric short circuit. Since the electrode on the multilayered grown layer is made of Au having high malleability as described already, Au is stretched and torn off when the wafer is cut, and an expanding electrode portion is unavoidably formed around the periphery of the laser chip.

The inventor has also clarified that the corners of the laser chip are likely to crack, and a short-circuit can also develop due to such a crack.

SUMMARY OF THE INVENTION

The present invention is therefore directed to provide a novel light emitting device having high production yield and high reliability.

Among the inventions disclosed herein, the following is a typical example.

In the light emitting device in accordance with the present invention, an anode electrode portion is not extended around the periphery of the laser chip, except at a portion corresponding to the end surface of a resonator which emits the laser light, in order to prevent the occurrence of a short-circuit due to the hanging electrode. The corners of the anode electrode corresponding to the corners of the laser chip can be chamfered so that they are positioned further away from the corners of the laser chip. Even if the corners of the laser chip undergo breakage when the wafer is scribed and cracked to provide the laser chips, the probability that the crack portion reaches the anode electrode portion is extremely low because the corners of the laser chip are chamfered as described above. In consequence, hang-down of the electrode due to cracks of the corners of the laser chip can be prevented, and the ratio of occurrence of short-circuits due to the hanging electrode portion can be reduced.

DESCRIPTION OF THE PREFERRED EMBODIMENTS

Embodiment 1

Figure 1:
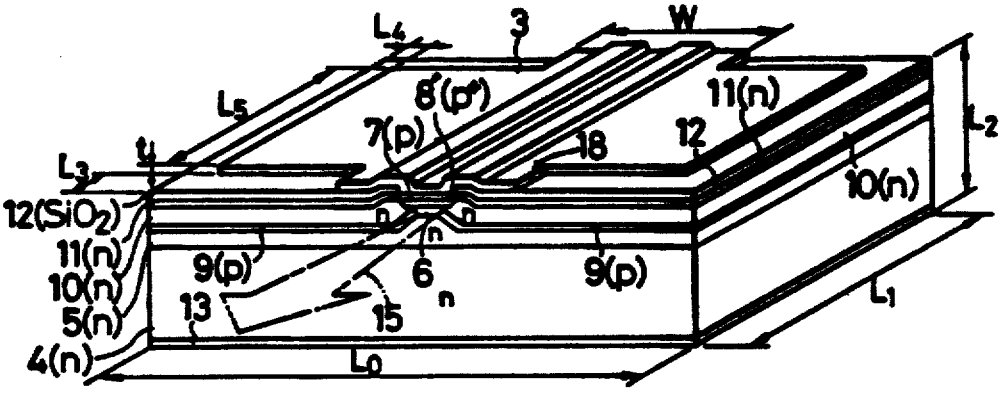
FIG. 1 is a perspective view of a laser chip in accordance with a first embodiment of the present invention.
Figure 3:
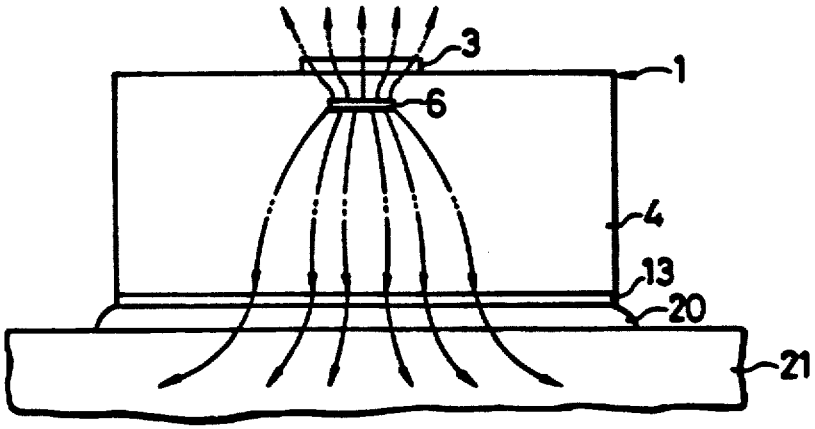
FIG. 3 is a schematic view showing the state of exothermy under the state in which the laser chip is actually mounted.
Figure 4:
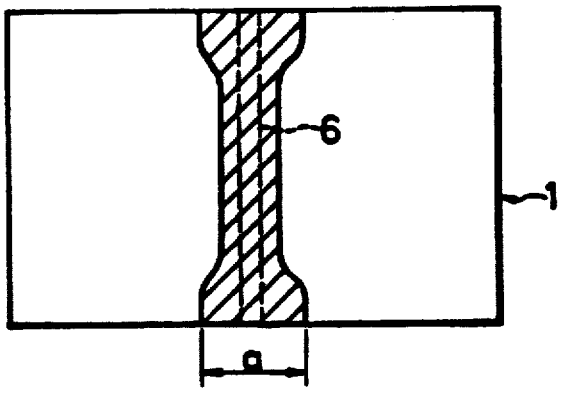
FIG. 4 is a schematic plan view showing also the state of exothermy under the state in which the laser chip is actually mounted.
Figure 5:
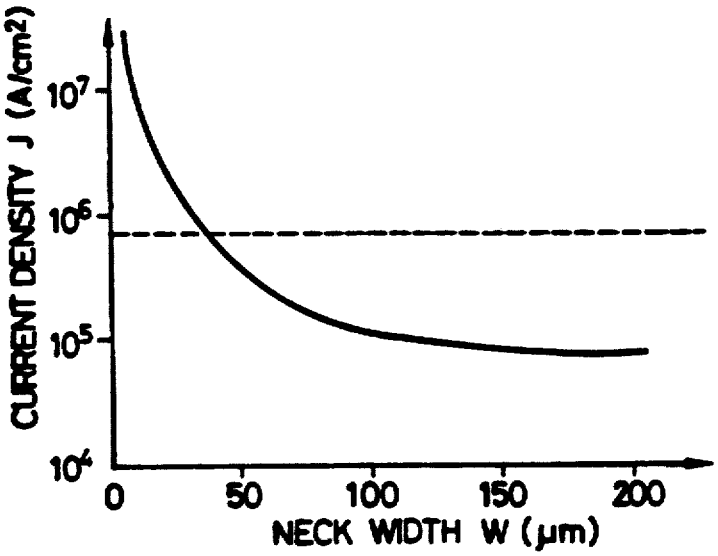
FIG. 5 is a diagram showing the relation between the width of a neck portion of an anode electrode corresponding to the end portion of a resonator and a current density.
Figure 6:
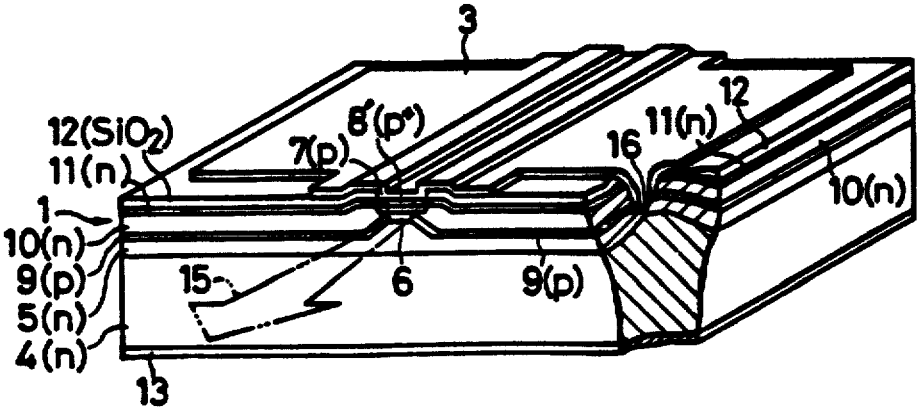
FIG. 6 is a perspective view showing the state under which a corner of the laser chip shown in FIG. 1 breaks off and short-circuit develops due to the breakage.

FIG. 1 is a perspective view of a laser chip in accordance with a first embodiment of the invention, FIG. 3 is a schematic view showing th state of exothermy under the state in which the laser chip is actually mounted, FIG. 4 is a schematic plan view showing also the state of exothermy of the laser chip and FIG. 5 is a diagram showing the relation between the neck portion of an anode electrode corresponding to the end portion of a resonator and a current density.

This embodiment illustrates an example in which the present invention is applied to a long wave semiconductor laser chip of a buried heterostructure (BH).

Laser chips are produced by cutting a compound semiconductor wafer, on which chips have been formed, by cleavage, scribing, cracking and the like, in longitudinal and transverse directions in the grid form. The laser chip in this embodiment is characterized by the pattern of an anode electrode which is disposed at a position as close as from 3 to 4 μm to a resonator, as shown in FIG. 1. This electrode pattern can be freely changed by selecting a suitable mask pattern for evaporation and etching to be used for producing the electrode.

The structure of the laser chip will be first described before the characterizing feature of this electrode pattern is described.

A multi-layered grown layer is produced by first forming a buffer layer 5 made of n-type InP on a main plane of a substrate 4 made of n-type In-P (the upper surface: (100) crystal plane), after which an active layer (resonator) 6 made of In-Ga-As-P, a cladding layer 7 made of p-type InP and a cap layer 8 made of $p^+$-type InGaAsP are formed in strip on the buffer layer 5. This multi-layered grown layer has a cross-sectional shape of an inverted triangle, and forms a so-called inverted mesa structure. The side surface of this inverted mesa structure is a (111) crystal plane on which In appears. The portion below the lower end of this inverted mesa plane portion is a forward mesa structure which expands gently. A blocking layer 9 made of p-type InP, a buried layer 10 made of n-type InP and a cap layer 11 made of InGaAsP are buried in the laminate state on each side of this multi-layered grown layer. The main surface portion of the multi-layered grown layer on the side of the substrate 4 except the electrode contact region is covered with an insulating film ($SiO_2$ film) 12. The anode electrode 3 consisting of an Au type electrode is formed on the main surface of the substrate 4.

A cathode electrode 13 of an Au type is disposed on the reverse of the substrate 4. Zinc (Zn) is diffused into the surface layer portion of the cap and cladding layers 8 and 7, thereby forming an ohmic contact layer consisting of a $p^+$-type Zn diffusion region.

The laser chip 1 is, for example, 400 μm wide ($L_0$) 300 μm long ($L_1$) and 100 μm high ($L_2$), and the active layer 6 is about 2 μm wide and about 0.15 μm thick.

Next, the characterizing feature of the electrode structure will be described.

As can be seen from FIG. 1, the anode electrode 3 is not disposed over the entire upper surface of the laser chip 1. The anode electrode 3 extends on the peripheral portion of the laser chip 1 corresponding to the end portion of the resonator 6, but the other peripheral portions of the anode electrode 3 are recessed by a distance of $L_3$, $L_4$ (e.g. $L_3=L_4=50$ μm) from the periphery of the laser chip 1. In the preferred embodiment, the width W of the electrode 18 (neck width) on the end portions of the resonator covering the end portions is 100 μm, and the length $L_5$ of the anode electrode 3 extending along the resonator at the portion other than on the resonator is 200 μm.

Since the anode electrode 3 is not disposed around the periphery of the laser chip 1, the electrode 3 is prevented from hanging down on the side surfaces of the chip 1 at the time of scribing. Since the anode electrode 3 is disposed over the entire length of the active layer (resonator) 6, on the other hand, the carrier injection efficiency as well as the light emitting efficiency do not drop near the end surfaces of the resonator, and the occurrence of self-excitation pulse oscillation (pulsation) can also be prevented.

The dimension of the anode electrode 3 is designed in consideration of heat radiation at the time of driving the laser and the purpose of securing a sufficient area for connecting the bonding wire.

First, exothermy at the time of driving the laser will be examined. As can be understood from the temperature distribution shown in FIG. 4, heat resistance is great at the end surface portions of the resonator of the laser chip 1 and range of temperature rise is great. Specifically, the hatched region in FIG. 4 represent a high temperature region, and its contour represents an isothermal line. Almost all the heat generated at the portion of the resonator 6 in the laser chip 1 escapes to a support 21 through the substrate 4 and a solder 20 as indicated by an arrow in FIG. 3. However, when the laser is operated at a high current, the heat that escapes by convection or radiation through the electrode 3 on the end portions of the resonator, which is spaced apart from the resonator 6 by about 3 to 4 μm, cannot be neglected. The width a of the high temperature region is about 100 μm as shown in FIG. 4, and the neck width W of the electrode 18 on the end portions of the resonator must be at least 100 μm in response to the width a in consideration of the heat radiation efficiency. If the neck width W becomes greater, however, the cut width of the anode electrode 3 when the wafer is cut off becomes greater, so that the projecting portion of Au that is torn off will become greater, and the probability of short-circuit will become also greater. For this reason, the neck width is preferably as small as possible. Therefore, the neck width W of the electrode 18 on the end portions of the resonator is prescribed to be 100 μm.

The neck width W of the electrode on the end portions of the resonator is also associated greatly with electromigration. The redundancy of electromigration is represented by a diagram whose ordinate represents a current density J ($A/cm^2$) and whose absciassa represents the neck width W (μm), as shown in FIG. 5. Its curve is given by the following equation:

$$J = \frac{I_{max}}{W \cdot t}\left(1 - \frac{L_5}{L_1}\right) \quad (1)$$

where $I_{max}$ is a maximum allowable current, W is the neck width, t is the thickness of the electrode, $L_1$ is the length of the resonator, and $L_5$ is the length of the peripheral electrode along the resonator.

The dotted line in the diagram represents an allowable current density ($6\times10^5$ $A/cm^2$) of Au. The neck width W is 100 μM in view of the heat radiation effect as described above. Therefore, the thickness t of the anode electrode 3 is determined to be 0.6 μm by putting the values $W=100$ μm and $I_{max}=6\times10^5$ A/cm$^2$ into equation (1).

The distance $L_3$, $L_4$ between the periphery of the anode electrode and the periphery of the chip is decided to be 50 μm in view of the fact that a sufficient area is necessary for connecting a bonding wire.

The pattern dimension of the electrode is determined in the manner described above.

As described above, the present invention is characterized in that the electrode 3 consists of the first electrode portion (width W) extending on the active layer 6 and the second electrode portion connected integrally to the first electrode portion and having the periphery thereof out of contact from the periphery of the main surface of the laser chip.

Embodiment 2

Figure 2:
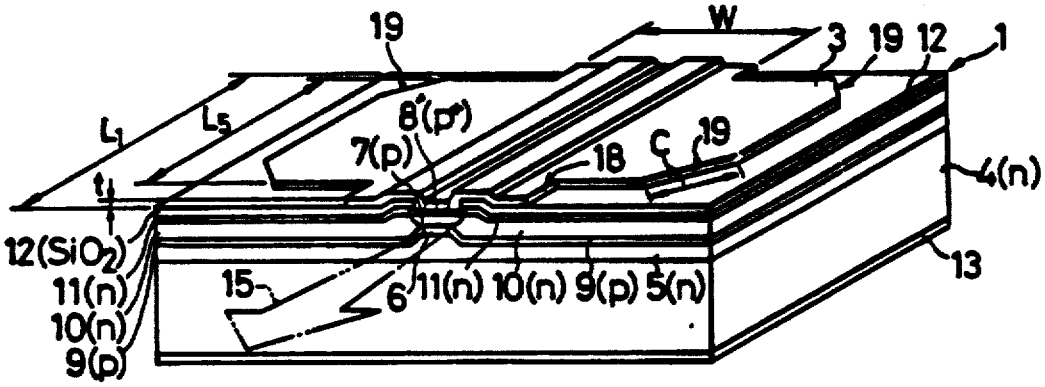
FIG. 2 is a perspective view of a laser chip in accordance with a second embodiment of the present invention.

The characterizing feature of a second embodiment of the present invention is that chamfer portions 19 are formed at the four corners of the anode electrode 3, as shown in FIG. 2.

Even if the electrode 3 is recessed from the periphery of the laser chip as in the first embodiment, a hangdown portion 16 will occur from the Au electrode 3 if the corner portion or portions of the laser chip break off, and will result in the junction short-circuit.

If the chamfer portions 19 are disposed on the anode electrode 3 (the second electrode portion), the probability of occurrence of such a short-circuit can be reduced. The chamfer length C is decided to be 30 μm, for example, in order to reduce the probability that a crack at the corner portion extends to the anode electrode 3.

Even when the corners of the rectangular laser chip 1 breaks off from time to time, the probability that the crack reaches the anode electrode portion 3 is extremely low because the corners of the laser chip 1 are chamfered. Therefore, the electrode does not hang down even when any crack reaching the electrode portion 3 occurs due to the crack of the corners of the laser chip 1, and the ratio of occurrence of short-circuits due to the hanging electrode portion can be reduced.

The foregoing two embodiments of the invention provide the following effects.

(1) In the light emitting device of the present invention, the anode electrode portion does not extend around the periphery of the laser chip except the peripheral portion of the laser chip that corresponds to the end portion of the resonator emitting the laser light. Therefore, the occurrence of the short-circuit caused by the hanging Au electrode, that is formed at the time of scribing, can be prevented. In the second embodiment, in particular, since the corner portions of the anode electrode corresponding to the corners of the rectangular laser chip are chamfered and are further spaced apart from the latter, the probability is extremely low that those crack portions of the corners of the laser chip, which may occur upon scribing and cracking of the wafer to produce the laser chips, reach the anode electrode portion. Because the anode electrode portion does not break off as described above, the electrode does not hang down due to the crack of the corners of the laser chip, and the ratio of occurrence of shortcircuits due to the swelling electrode portions can be reduced.

(2) When forming the anode electrode 3 of the laser chip 1 of the present invention, the electrode pattern can be formed by changing either the pattern of an evaporation mask or the pattern of an etching mask. Therefore, the production cost does not rise, and no trouble occurs even when the chip structure is changed.

(3) The effect (1) improves the production yield when cutting off the wafer to obtain the laser chips 1, and the production cost can be reduced consequently.

(4) The semiconductor laser chip in accordance with the present invention can reduce the occurrence of defects relating to the appearance such as the electrode extending on the peripheral surface of the laser chip; hence the production yield can be improved.

EMBODIMENT 3

Figure 7:
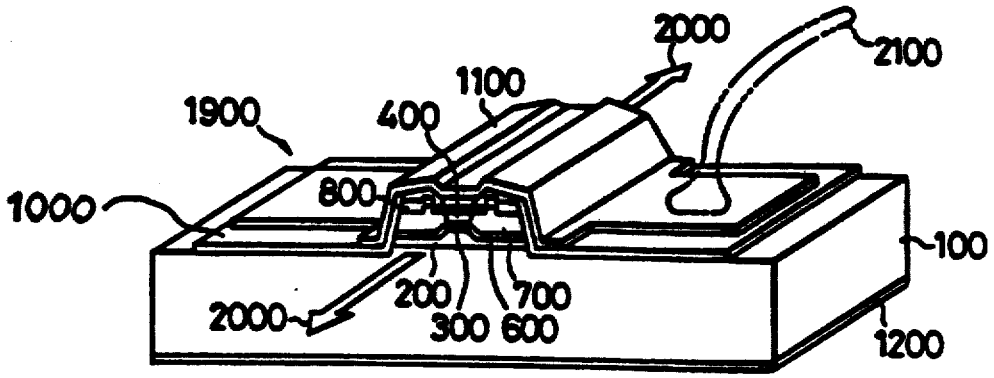
FIG. 7 is a perspective view showing a laser chip in accordance with a third embodiment of the present invention.

FIG. 7 is a perspective view of a BH type semiconductor laser chip in accordance with a third embodiment of the present invention, and FIGS. 8 through 12 are sectional views of the BH type semiconductor laser chip during its production process.

This embodiment is characterized in that buried layers 700 and blocking layers 600 that interpose an active layer 300 from both of its sides are locally disposed on a substrate 100, as shown in FIG. 7. Besides the effects brought forth by the first and second embodiments, this embodiment provides the following effects.

In this semiconductor laser chip of this embodiment, the portions of the buried regions spaced apart from the active layer are removed, the length of an exposed p-n junction is small, and most of the periphery of the anode electrode is recessed inward by dozens of microns from the periphery of the insulating film. Therefore, degradation of the withstand voltage and shortcircuits are not likely to occur even when foreign matter is deposited or the hanging electrode material develops, and both production yield and reliability can be improved.

The wire connection portion of the semiconductor laser chip in accordance with the present invention is arranged above the substrate where laser oscillation is not effected. Therefore, even when wire bonding is conducted, the chip characteristics do not deteriorate. On the contrary, the chip characteristics become high quality, and the production yield can be improved.

Next, the production process of the semiconductor laser chip will be explained briefly.

Figure 8:
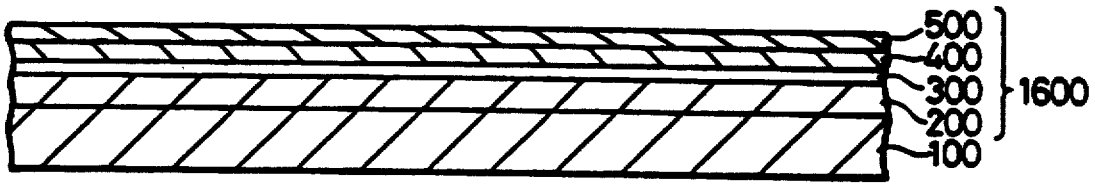
FIG. 8 is a sectional view of a wafer in one production process of a BH type semiconductor laser chip in accordance with still another embodiment of the present invention.

First of all, a compound semiconductor substrate 100 is prepared as shown in FIG. 8. This substrate is made of n-type InP. A multi-layered grown layer 1600 consisting of a buffer layer 200 of n-type InP, an active layer 300 of InGaAsP, a cladding layer 400 of p-type InP and a cap layer 500 of p-type InGaAsP is formed on the (100) crystal plane of the substrate 100 by the liquid epitaxial method. The buffer layer 200, the active layer 300 and the cladding layer 400 form a double heterostructure. The substrate is about 200 μm thick, the active layer 3 is 0.15 μm thick and the rest of layers are from about 1 to about 2 μm thick.

Figure 9:
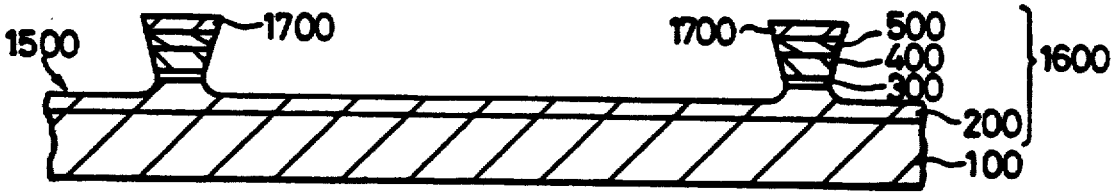
FIG. 9 is a sectional view of the wafer after etching has been applied thereto.

Next, an insulating film ($SiO_2$) is formed on the main plane (upper surface) of a wafer 1500 by chemical vapor deposition (CVD) as shown in FIG. 9, and this insulating film is partially removed by photolithography to form a large number of stripe-like masks 1700, which are from 5 to 6 μm wide, in a direction parallel to the direction of <110> cleavage. Thereafter, the semiconductor layer of the wafer 1500 exposed from the masks 1700 is etched by an etching solution such as bromoethanol. Etching is conducted in such a manner as to reach the intermediate depth of the buffer layer 200 or the surface layer portion of the substrate 100. In this embodiment, etching reaches the intermediate depth of the buffer layer 200. The upper portion of the active layer 300 covered with the masks 1700 becomes the inverted mesa structure exhibiting an inverted triangular cross-section as a result of anisotropic etching, and remains in the stripe form along the <100> direction of the crystal. The portion below the active layer 300 forms the forward mesa portion describing curves. The mask space is about 400 μm.

Figure 10:
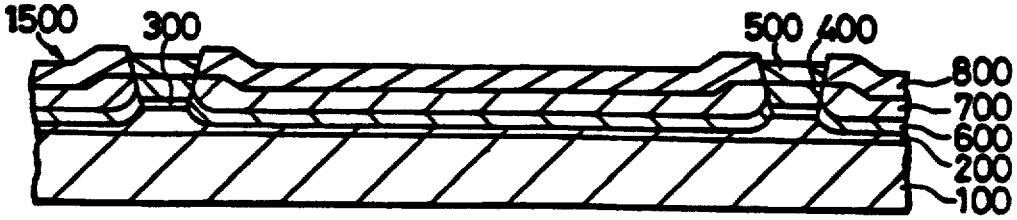
FIG. 10 is a sectional view of the wafer after burying and growing treatment has been applied thereto.

Next, the masks 1700 extending partially on the main surface of the wafer 1500 are removed. Then, a blocking layer 600 on p-type InP, a buried layer 700 of n-type InP and a cap layer 800 of n-type InGaAsP are sequentially buried into the portion that is recessed by etching, by the epitaxial method as shown in FIG. 10. These three layers will sometimes be called merely "the buried layer" in this specification.

When the laser chips of the first and second embodiments are produced, an insulating film such as 12 shown in FIGS. 1 and 2 is formed on portions of the upper surface other than over the inverted mesa, and then electrodes having a desired shape are formed on both main planes of the laser chip. The wafer is then cut off to obtain the laser chips. When the laser chip of the third embodiment is produced, the following process is carried out.

Figure 11:
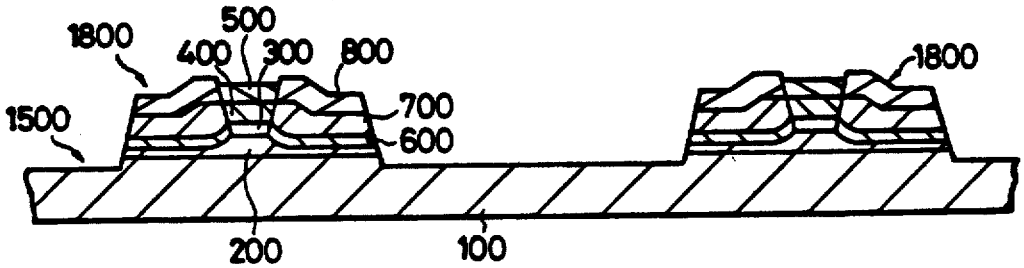
FIG. 11 is a sectional view of the wafer after a part of the buried grown layer has been removed.

The portion of the buried layer apart from the active layer, that is, the intermediate portion of the active layers 300 of two laser chips, is removed by photolithography technique, as shown in FIG. 11. A mesa portion which is about 100 μm wide with the mesa portion being the center is formed. To completely remove the portion of the buried layer to be removed, the removing operation is carried out so as to reach the surface layer portion of the substrate 100. This step forms only the necessary portion for emitting the light on the semiconductor substrate.

Figure 12:
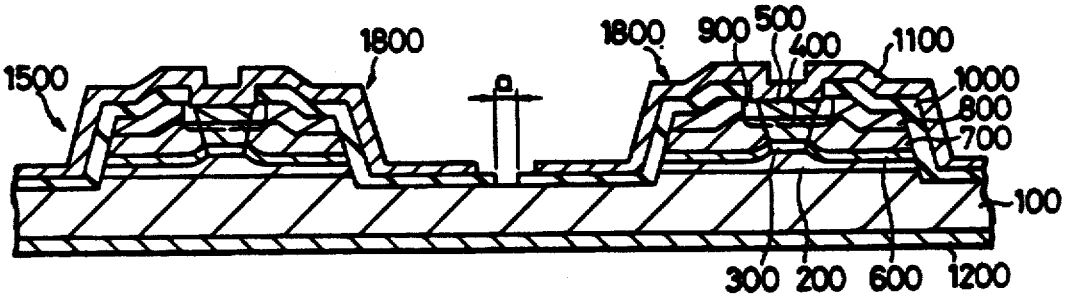
FIG. 12 is a sectional view of the wafer after an insulating film and an electrode have been formed.

Next, an insulating film 1000 consisting of $SiO_2$ or the like is formed partially on the main plane of the wafer 1500. Therefore, the ends of p-n junction exposed from the side surfaces are covered with this insulating film 1000. The insulating film 1000 is not disposed in the cut-off region in a direction crossing the cleavage plane of the wafer 1500 at right angles (the scribe area represented by a width a) and on the surface layer portion of the inverted mesa portion, as shown in FIG. 12. Next, zinc (Zn) is introduced into the main plane of the wafer 1500 using the insulating film 1000 as the mask, and a Zn diffusion layer 9 reaching the intermediate depth of the cladding layer 400 is formed. This Zn diffusion layer 900 functions as an ohmic layer of a contact electrode. An anode electrode 1100 is disposed on the main plane of the wafer 1500 and a cathode electrode 1200, on its reverse. Though the cathode electrode 122 is disposed on the entire reverse surface of the wafer 1500, the anode electrode 1100 is disposed at the portions other than the entire portion of the mesa portion 1800 (i.e. the end portions of the mesa where light is emitted are, of course, left uncovered) and other than the peripheral portions of the insulating film 1000 placed directly on the substrate 100 (the region which is dozens of microns wide from the periphery of the insulating film, exclusive of the portions of the proximity of the mesa portion 1800). This means that the anode electrode 1100, too, is disposed as a stripe pattern having equidistance contracted portions on the main plane of the wafer 1500. The line direction connecting these contracted portions is the cleavage plane. The reverse of the wafer 1500 is etched before the cathode electrode 1200 is disposed thereon, and the wafer 1500 is about 100 μm thick as a whole.

Next, external force is applied to one end portion of the wafer 1500 by a diamond tool or the like, and a scratch for cleavage is equidistantly formed along the cleavage plane of the crystal. External bending stress is then applied to the wafer 1500 to effect cleavage, and rectangular slices are obtained. Scribes are formed in a scribe area of the slice by a diamond tool or the like in a direction crossing the cleavage line at right angles, and the slices are cut by cracking along the scribes, thereby forming a large number of laser chips.

A view of the laser chip 1900 of the third embodiment after the individual chips have been separated can be seen in FIG. 7. The dimensions are, for example, 400 μm wide, 300 μm long and 100 μm deep. When a predetermined voltage is applied across the anode electrode 1100 and the cathode electrode 1200, the end surface of the active layer (the mirror surface) which is 300 μm long oscillates the laser light 2000. The laser chip is used while being fixed to a support via either the anode electrode 1100 or the cathode electrode 1200 in practice. When, for example, the laser chip is fixed to a support made of high thermal conductivity SiC ceramic (thermal conductivity: 25 W/deg.cm) via a solder, the cathode electrode 1200 can be used as the fixing surface, and the wire 2100 can be connected to the anode electrode 1100 which is directly placed on the substrate 100. In this case, the impact at the time of wire bonding is applied to the substrate 100 which hardly affects the chip characteristics, and does not affect the active region (consisting of the active layer 300 and the blocking layer 600) which oscillates the laser. It is therefore possible to prevent the degradation of the laser chip characteristics by wire bonding when wire bonding is carried out.

Although the invention has been described in conjunction with specific laser structures, it is to be understood that the particular teachings regarding the anode electrode structure could be used in conjunction with other laser structures to obtain the aforementioned advantages. As an example of another laser structure which could be used, attention is directed to U.S. Ser. No. [721,028] *712,028, U.S. Pat. No. 4,731,790* of Masaaki Sawai, filed on even date herewith and entitled "Semiconductor Laser Chip", which is hereby incorporated by reference.

Also, although particular dimensions have been given in the description, it is to be understood that these are for purposes of example, and can be modified without departing from the scope of the present invention.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A light emitting device comprising:

(1) a semiconductor block consisting essentially of:

(a) a first main plane;

(b) a second main plane facing said first main plane;

(c) a first end surface interposed between said first and second main planes;

(d) a second end surface facing said first end surface and interposed between said first and second main planes;

(e) a first side wall interposed between said first and second main planes and said first and second end surfaces;

(f) a second side wall facing said first side wall and interposed between said first and second main planes and said first and second end surfaces; and (g) a light emitting region having a longitudinal axis extending between said first and second end surfaces so that one of the ends thereof is exposed on said first end surface and the other end thereof is exposed on said second end surface, wherein said second main [surface] *plane* has a periphery including end peripheral edges at intersections of said second main plane and said first and second end surfaces and side peripheral edges at the intersections of said second main plane and said first and second side walls; and (2) an electrode consisting essentially of:

(a) a first electrode portion disposed on said second main plane of said semiconductor block along said light emitting region, and having the width thereof greater than the width of said light emitting region; and (b) a second electrode portion disposed on said second main plane of said semiconductor block, connected completely integrally with said first electrode portion, and having a periphery thereof recessed along said second main plane to be out of contact from both the end peripheral edges and the side peripheral edges of the periphery of said *second* main plane, wherein the length of said first electrode portion in a direction parallel to the longitudinal axis of said light emitting region is at least longer than that of said second electrode portion.

*2. A light emitting device comprising:*

*a) a semiconductor block having a first main plane and a second main plane facing said first main plane:*

*b) a first end surface and a second end surface of said semiconductor block facing to each other and being interposed between said first and second main planes;*

*c) a first side wall and a second side wall of said semiconductor block facing to each other and being interposed between said first and second main planes and between said first and second end surfaces;*

*d) a light emitting region extending between said first and second end surfaces so that one of the ends thereof is exposed on said first end surface and the other end thereof is exposed on said second end surface, wherein said second main plane has end peripheral edges at intersections of said second main plane and said first and second end surfaces, and said second main plane further includes side peripheral edges at intersections of said second main plane and said first and second side walls; and*

*e) an electrode disposed on said second main plane of said semiconductor block, said electrode having a first side being substantially in parallel with said side peripheral edges and a second side being substantially in parallel with said end peripheral edges, wherein said first and second sides of said electrode are recessed from both said side peripheral edges and said end peripheral edges, respectively.*

*3. A light emitting device according to claim 2, wherein said electrode has a bonding area to which a bonding wire is to be bonded, wherein said bonding area is positioned so as not to be directly over said light emitting region, and wherein said bonding wire is connected to said bonding area of said electrode.*

*4. A light emitting device according to claim 2, wherein portions of said electrode in proximity of corners of said semiconductor block are chamfered.*

*5. A light emitting device according to claim 2, further comprising an insulating film formed between said second main plane and said electrode, wherein said insulating film has an opening portion disposed over said light emitting region, and wherein a portion of said electrode is electrically connected to said light emitting region through said opening portion so that operating current for said light emitting device is supplied to said light emitting region.*

*6. A light emitting device according to claim 5, wherein said insulating film is a silicon dioxide film.*

*7. A light emitting device according to claim 5, wherein said electrode is comprised of gold.*

*8. A light emitting device according to claim 1, wherein said electrode is an anode electrode for said light emitting device.*

*9. A light emitting device according to claim 5, wherein said electrode is an anode electrode for said light emitting device.*

*10. A light emitting device comprising:*

*a) a semiconductor block having a first main plane and a second main plane facing said first main plane;*

*b) a first end surface and a second end surface of said semiconductor block facing to each other and being interposed between said first and second main planes;*

*c) a first side wall and a second side wall of said semiconductor block facing to each other and being interposed between said first and second main planes and between said first and second end surfaces;*

*d) a light emitting region extending between said first and second end surfaces so that one of the ends thereof is exposed on said first end surface and the other end thereof is exposed on said second end surface, wherein said second main plane has end peripheral edges at intersections of said second main plane and said first and second end surfaces, and said second main plane further including side peripheral edges at intersections of said second main plane and said first and second side walls; and*

*e) an electrode disposed on said second main plane of said semiconductor block, said electrode having a first portion extending over said light emitting region and a second portion disposed so as not to be directly over said light emitting region, wherein said second portion of said electrode has a periphery recessed from both said side peripheral edges and said end peripheral edges.*

*11. A light emitting device according to claim 10, wherein said semiconductor block includes a multi-layered grown layer which is comprised of a buffer layer of an n-type InP, an active layer of InGaAsP on said buffer layer and a cladding layer of a p-type InP on said active layer, wherein said light emitting region is formed in said active layer of said multi-layered grown layer.*

*12. A light emitting device according to claim 11, wherein said multi-layered grown layer forms a double heterojunction structure.*

*13. A light emitting device comprising:*

*a) a box-shaped semiconductor chip having a tetragonal main surface, said tetragonal main surface having first parallel edges and second parallel edges;*

*b) a light emitting region formed in said box-shaped semiconductor chip, said light emitting region extending substantially in parallel with said tetragonal main surface and said second parallel edges; and*

*c) an electrode formed on said tetragonal main surface, said electrode including a first portion and a second portion, said first portion of said electrode being disposed over said light emitting region and extending along said second parallel edges, said second portion of said electrode extending from said first portion along said first parallel edges,*

*wherein said second portion of said electrode is recessed from at least one of said first parallel edges and at least one of said second parallel edges.*

*14. A light emitting device according to claim 13, wherein a bonding wire for providing operating current to said light emitting device is connected to said second portion of said electrode.*

*15. A light emitting device according to claim 13, wherein said box-shaped semiconductor chip includes a multi-layered grown layer which is comprised of a buffer layer of an n-type InP, an active layer of InGaAsP on said buffer layer and a cladding layer of a p-type InP on said active layer, wherein said light emitting region is formed in said active layer of said multi-layered grown layer.*

*16. A light emitting device according to claim 15, wherein said multi-layered grown layer forms a double heterojunction structure.*

*17. A light emitting device comprising:*

*a) a box-shaped semiconductor chip having a tetragonal main surface, said tetragonal main surface having first parallel edges and second parallel edges;*

*b) a light emitting region formed in said box-shaped semiconductor chip, said light emitting region extending substantially in parallel with said tetragonal main surface and said second parallel edges; and*

*c) an electrode formed on said tetragonal main surface, said electrode including a first portion and a second portion, said first portion of said electrode being disposed over said light emitting region and extending along said second parallel edges, said second portion of said electrode extending from said first portion along said first parallel edges,*

*wherein said second portion of said electrode has a periphery which is not extended to at least one of said first parallel edges and at least one of said second parallel edges.*

*18. A light emitting device according to claim 17, wherein a bonding wire for providing operating current to said light emitting device is connected to said second portion of said electrode.*

*19. A light emitting device according to claim 17, wherein said box-shaped semiconductor chip includes a multi-layered grown layer which is comprised of a buffer layer of an n-type InP, an active layer of InGaAsP on said buffer layer and a cladding layer of a p-type InP on said active layer, wherein said light emitting region is formed in said active layer of said multi-layered grown layer.*

*20. A light emitting device according to claim 19, wherein said multi-layered grown layer forms a double heterojunction structure.*

*21. A light emitting device comprising:*

*a) a box-shaped semiconductor chip having a tetragonal main surface, said tetragonal main surface having first parallel edges and second parallel edges;*

*b) a light emitting region formed in said box-shaped semiconductor chip, said light emitting region extending substantially in parallel with said tetragonal main surface and said second parallel edges; and*

*c) an electrode formed on said tetragonal main surface, said electrode including a first portion and a second portion, said first portion of said electrode being disposed over said light emitting region and extending along said second parallel edges, said second portion of said electrode extending from said first portion toward said second parallel edges along said first parallel edges,*

*wherein said second portion of said electrode has a periphery spaced from at least one of said first parallel edges and at least one of said second parallel edges.*

* * * * *